(12) United States Patent
Dasasathyan et al.

(10) Patent No.: US 6,857,115 B1
(45) Date of Patent: Feb. 15, 2005

(54) PLACEMENT OF OBJECTS WITH PARTIAL SHAPE RESTRICTION

(75) Inventors: Srinivasan Dasasathyan, Sunnyvale, CA (US); Guenter Stenz, Campbell, CA (US); Sudip K. Nag, San Jose, CA (US); Jason H. Anderson, Toronto (CA)

(73) Assignee: Xilinx, Inc., San Jose, CA (US)

( * ) Notice: Subject to any disclaimer, the term of this patent is extended or adjusted under 35 U.S.C. 154(b) by 141 days.

(21) Appl. No.: 10/215,602

(22) Filed: Aug. 8, 2002

(51) Int. Cl.[7] .............................................. G06F 17/50
(52) U.S. Cl. ............................................ 716/9; 716/13
(58) Field of Search ............................. 716/9, 13, 2, 6

(56) References Cited

U.S. PATENT DOCUMENTS 6,389,580 B1 * 5/2002 Ozaki ............................. 716/6

2003/0005398 A1 * 1/2003 Cho et al. ....................... 716/8

OTHER PUBLICATIONS

U.S. Appl. No. 10/215,601, filed Aug. 8, 2002, Dasasathyan et al.

U.S. Appl. No. 10/215,979, filed Aug. 8, 2002, Anderson et al.

* cited by examiner

*Primary Examiner*—Stacy A. Whitmore
(74) *Attorney, Agent, or Firm*—H. C. Chan; Bernard Hoffman

(57) ABSTRACT

Application of network flow techniques to constrained optimization problems is disclosed. The present of constrains may lead to infeasible solutions. The infeasible solutions can be removed by an iterative process of changing the structure of the network and/or the associated parameters. Specific applications of the invention to the placement of tristate buffers and clocks in integrated circuits are disclosed.

26 Claims, 19 Drawing Sheets

452 generate a solution using global placement
454 draw a constraint graph
456 identifying critical clocks
458 create a flow network
460 find a valid solution
462 perform post-processing

← 450

| R1 | R2 | R3 | R4 |
|---|---|---|---|
| R1C1(20) | R2C1(30) | R3C1(19) | R4C1(30) |
| R1C2(26) | R2C2(18) | R3C2(26) | |
| R1C3(15) | R2C3(23) | R3C3(21) | R4C3(19) |
| R1C4(21) | R2C4(27) | R3C4(18) | R4C4(26) |
| | R6C1(19) | | R8C1(28) |
| | R6C2(29) | R7C2(26) | |
| R1C3(28) | R6C3(32) | R7C3(25) | R8C3(34) |
| R1C4(22) | R6C4(25) | R7C4(35) | R8C4(29) |
| R5 | R6 | R7 | R8 |

PLACEMENT OF OBJECTS WITH PARTIAL SHAPE RESTRICTION

FIELD OF THE INVENTION

This invention relates to network flow, and more particularly to the application of network flow techniques to constrained optimization problems.

BACKGROUND OF THE INVENTION

Many practical problems can be formulated and solved using network flow techniques. Some examples of such problems are: finding the fastest route between two locations in a city, determining the most efficient way to transport products from distribution centers to clients, and how best to route electricity from generating stations to buildings in a city. At a high-level, network flow techniques are applied as follows: First, the problem to be solved is analyzed and a "flow network" representing the problem is formulated. A flow network is a directed graph consisting of a set of nodes and edges. At least one of the nodes is designated as a source node; at least one of the nodes is designated as a sink node. Edges in the graph have a property called capacity and may also have a property called cost.

Intuitively, edges can be viewed as pipes and edge capacities represent the amount of fluid that may be sent through a pipe, and edge costs represent the cost of sending fluid through a pipe. Prior art techniques can be used to find the minimum cost, maximum network flow through the network from the source node(s) to the sink node(s). The solution to a network flow problem is a flow value for each edge (possibly zero). The network flow solution is translated into a solution for the original problem being solved; for example, flow along a particular edge in the network may imply the shipping of goods from a particular distribution center to a particular client. One limitation of the applicability of network flow techniques however is that they cannot be applied to problems having certain types of constraints. This is because these prior art techniques require that the network for which a flow is computed must be static. This eliminates the possibility of having dependencies in the flow network. Unfortunately, real life problems often have constraints and consequently, there are many problems to which network flow techniques cannot be applied.

A specific example will be used to illustrate the issue. In many engineering and operations research applications, it is important to be able to determine the optimal matching between a set of objects (e.g., electronic components, resources, people, etc.) with a set of slots (e.g., physical locations, tasks, buildings, people, etc.). An example is illustrated in FIG. 1A. It comprises a set of objects 102, 103, . . . , and 104 and a set of slots 106, 107, 108, . . . , and 109. The number of slots may be the same as or more than the number of objects. As a result, every object should match with one and only one of the slots. FIG. 1A shows a matching in which objects 102–104 are matched with slots 107, 106 and 109, respectively. Each edge in FIG. 1A has an associated cost, with the aim being to match the maximum number of objects to slots such that the cost of the matching is minimized. One method to find the minimum cost, maximum matching is the so-called "Hungarian algorithm". Information on this algorithm can be found in D. B. West, "Introduction to Graph Theory," Prentice Hall, Upper Saddle River, N.J., 2001.

It has been realized that the determination of the optimal matching is similar to the determination of maximum size, minimum cost flow in a flow network. FIG. 1B shows a network 130. Elements that are substantially the same in FIGS. 1A–1B share the same reference numerals. In FIG. 1B, network 130 contains a "virtual source" 132 that originates flows to various objects in a source vertex set 134. Virtual source 132 is not a physical source, and it is added to facilitate the determination of the optimal matching. The flows from the selected slots are collected by a "virtual sink" 138. Virtual sink 138 is not a physical sink, and it is added to complete the flow.

The possible connections between the objects, slots, virtual source, and virtual sink are called "edges." FIG. 1B shows the set of edges. Three of them are shown as reference numerals 142–144. There is one requirement in the flow network 130 for the matching problem: edges do not exist between objects and between slots. Thus, there is no edge between objects 102–104. Similarly, there is no edge between slots 106–109. Each edge is associated with a "capacity" and a "cost." Various prior art methods have been developed to find edges between virtual source 132 and virtual sink 138 that can deliver the maximum size, minimum cost flow from the source to the sink. Edges between vertex sets 134 and 136 with non-zero flow constitute the edges of a maximum size, minimum cost matching of objects to slots. These edges correspond to the optimal matching between objects and slots in FIG. 1A. Information on various network flow techniques can be found in R. K. Ahuja, T. L. Magnanti and J. B. Orlin, "Network Flows," Prentice Hall, 1993.

Prior art methods assume that the objects in vertex sets 134 and 136 are independent. However, in many applications (such as computer-aided design), some of the objects are related to each other. An example in computer-aided design is the placement of low voltage differential signaling (LVDS) input-output (I/O) ports (i.e., objects) in field programmable gate array (FPGA) devices. In an FPGA, there are many input-output block (IOB) sites (i.e., slots). Because LVDS is a differential standard, each LVDS input or output is built using two adjacent IOB sites whereas inputs or outputs of other I/O standards require only a single IOB. Consequently, the differential signals of LVDS need to be placed to adjacent IOBs.

DETAILED DESCRIPTION OF THE INVENTION

Figure 2A:
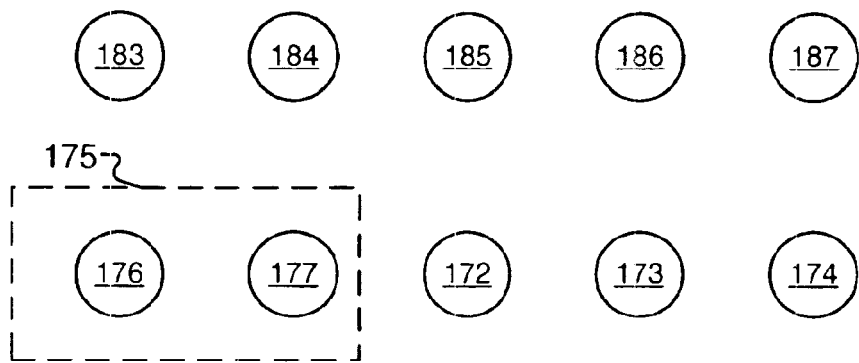
FIGS. 2A–2C are schematic diagrams showing one embodiment of the present invention.

FIG. 2A is a schematic diagram showing one embodiment of the present invention. It contains a plurality of objects, such as objects 172–174 and 176–177, and a plurality of slots, such as slots 183–187. In FIG. 2A, a dashed box 175 encloses objects 176 and 177. This is used to indicate that these two objects need to meet certain constraints. In this example, the constraint is that slots corresponding to objects 176 and 177 need to be adjacent to each other. It should be noted that the present invention can be used to handle a large variety of constraints. For example, the constrained objects and slots can have various spatial relationships.

Figure 2B:
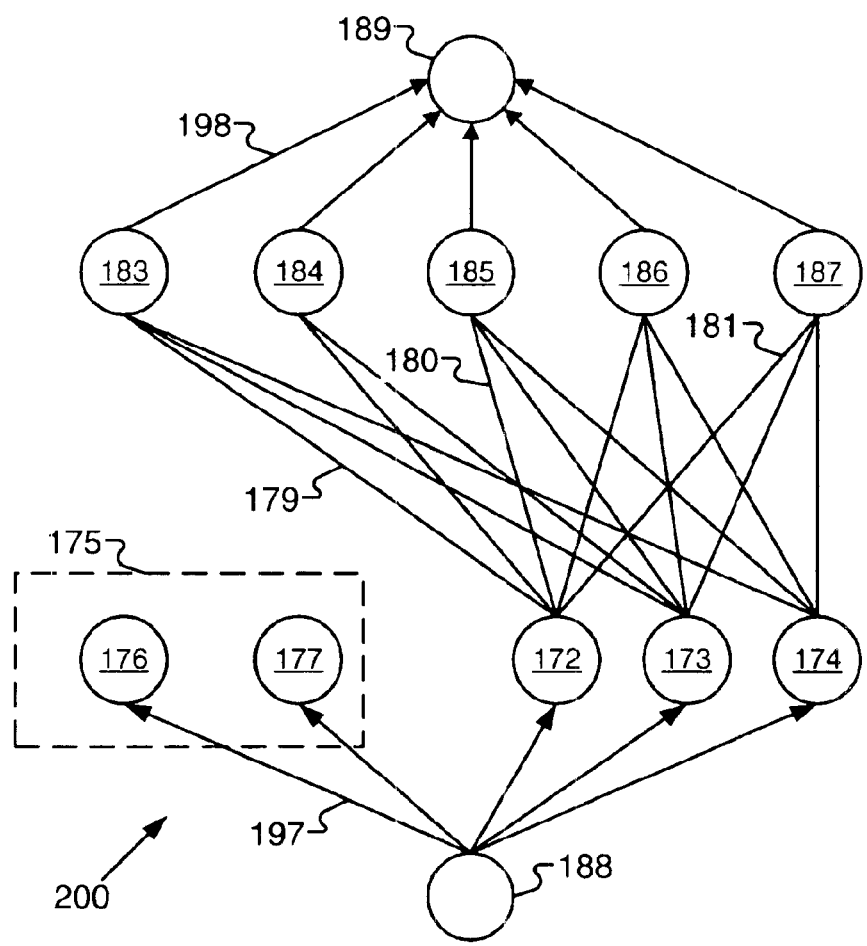

The present invention uses network flow as means for finding an optimal solution. In order to handle the constraints, two types of edges are used. The first type consists of edges formed between regular objects and all the slots. FIG. 2B shows this type of edge. Elements that are the same in FIGS. 2A and 2B have the same reference numerals. The first type of edge (such as 179–181) connects regular objects to slots (183–187). FIG. 2B also shows a virtual source 188 and a virtual sink 189. The first type of edge is also used to connect virtual source 188 to the objects (such as edge 197) and virtual sink 189 to the slots (such as edge 198).

Figure 2C:
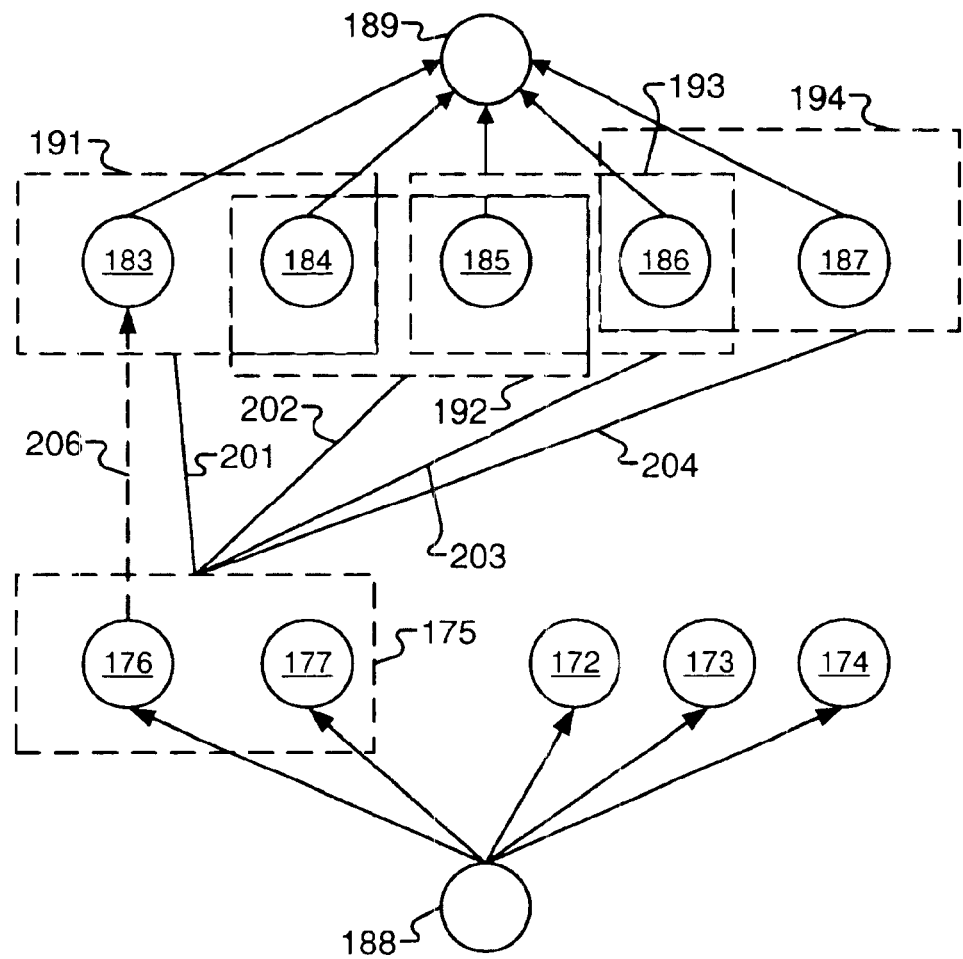

The second type of edge consists of edges formed between constrained objects and slots under the constraint. FIG. 2C shows this type of edge. Elements that are substantially the same in FIGS. 2B and 2C share the same reference numerals. The slots are grouped together so that they are under the imposed constraint. In FIG. 2C, all the adjacent slots are grouped in accordance with the constraint (i.e., constrained objects 176–177 need to be adjacent to each other). The groups are shown as dashed boxes 191–194. Edges 201–204 are formed between dashed box 175 and dashed boxes 191–194.

In the present invention, the edge between object 176 and slot 183 (shown as dashed line 206) is assumed to be representative of edge 201. Thus the cost of edge 201 may depend on the cost of edge 206. In a different embodiment, the cost of edge 201 may also depend on the cost of the edge between object 177 and 184, since the matching of node 176 to node 183 implies matching node 177 to 184. Similar representation is applied to edges 202–204. In this example, all edges in FIGS. 2B and 2C have unit capacity and may have an associated cost.

Figure 3A:
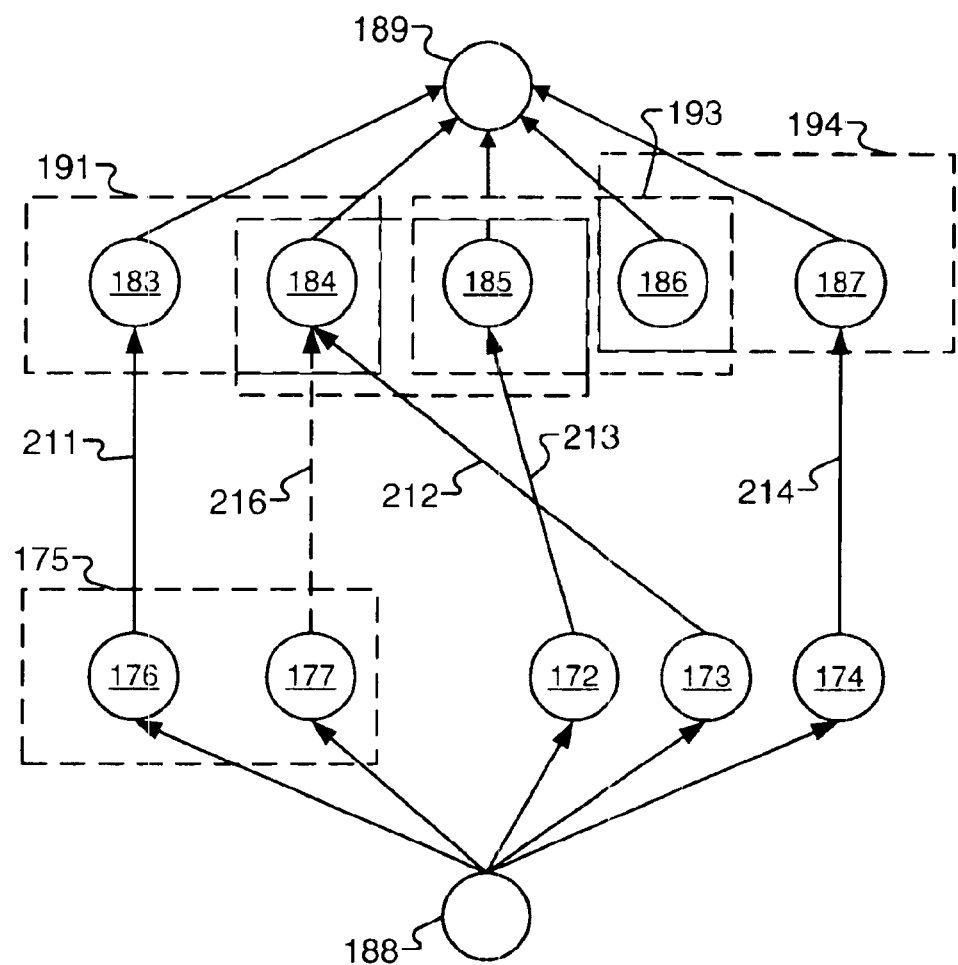
FIG. 3A shows an example of an infeasible solution that may be obtained using the method of the present invention.

Using the edges shown in FIGS. 2B and 2C, a matching is identified through the application of minimum cost, maximum network flow techniques. A possible solution is shown in FIG. 3A. The edges in FIG. 3A represent those edges with non-zero flow in the solution to the minimum cost, maximum network flow problem. Elements that are substantially the same in FIGS. 3A, 2B and 2C share the same reference numerals. The resulting solution edges are shown as edges 211–214. An edge (shown as dashed line 216) is inferred between object 177 and slot 184 because objects 176 and 177 are constrained, thus their corresponding slots need to be adjacent to each other. One problem with this matching is that it is infeasible because slot 184 is assigned to two objects, 177 and 173.

Figure 3B:
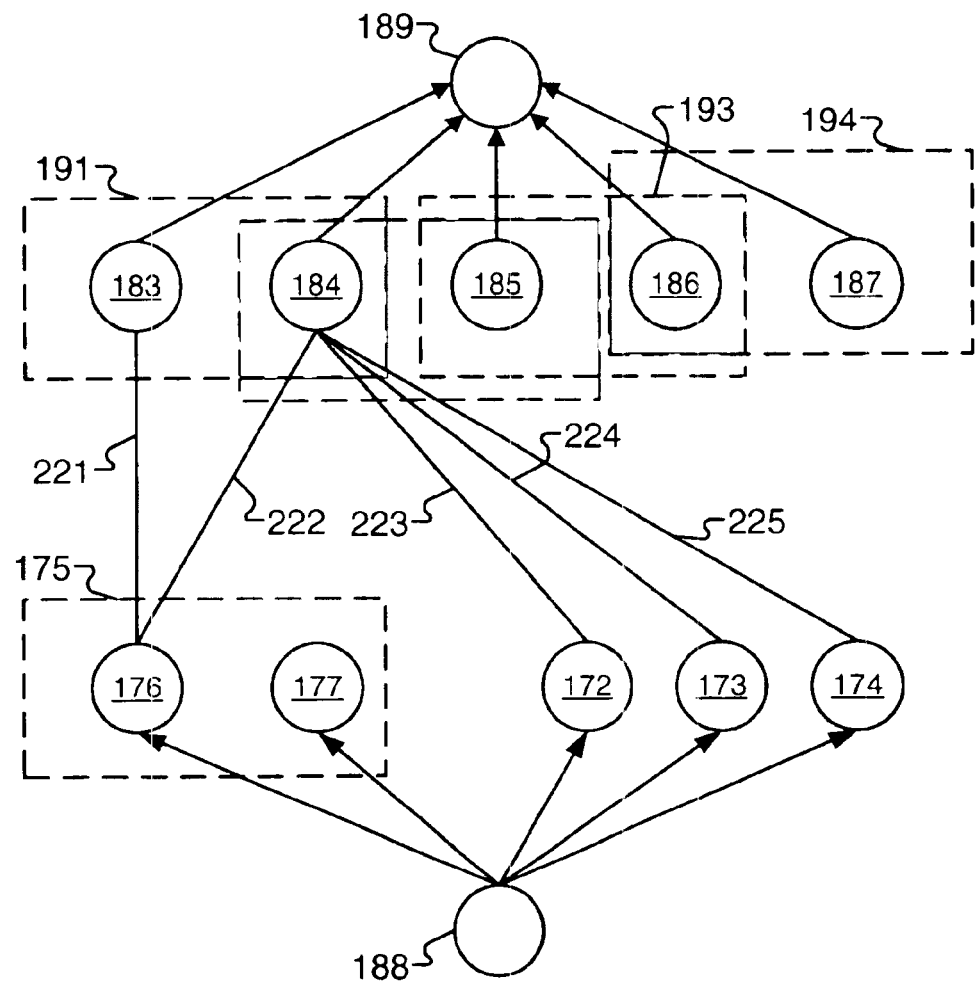
FIG. 3B shows the edges for which the costs need to be changed in accordance with the present invention.

In order to obtain a feasible matching, the costs (or other parameters) associated with slot 184 are changed. FIG. 3B shows the edges 221–225 for which the costs may need to be changed.

Figure 3C:
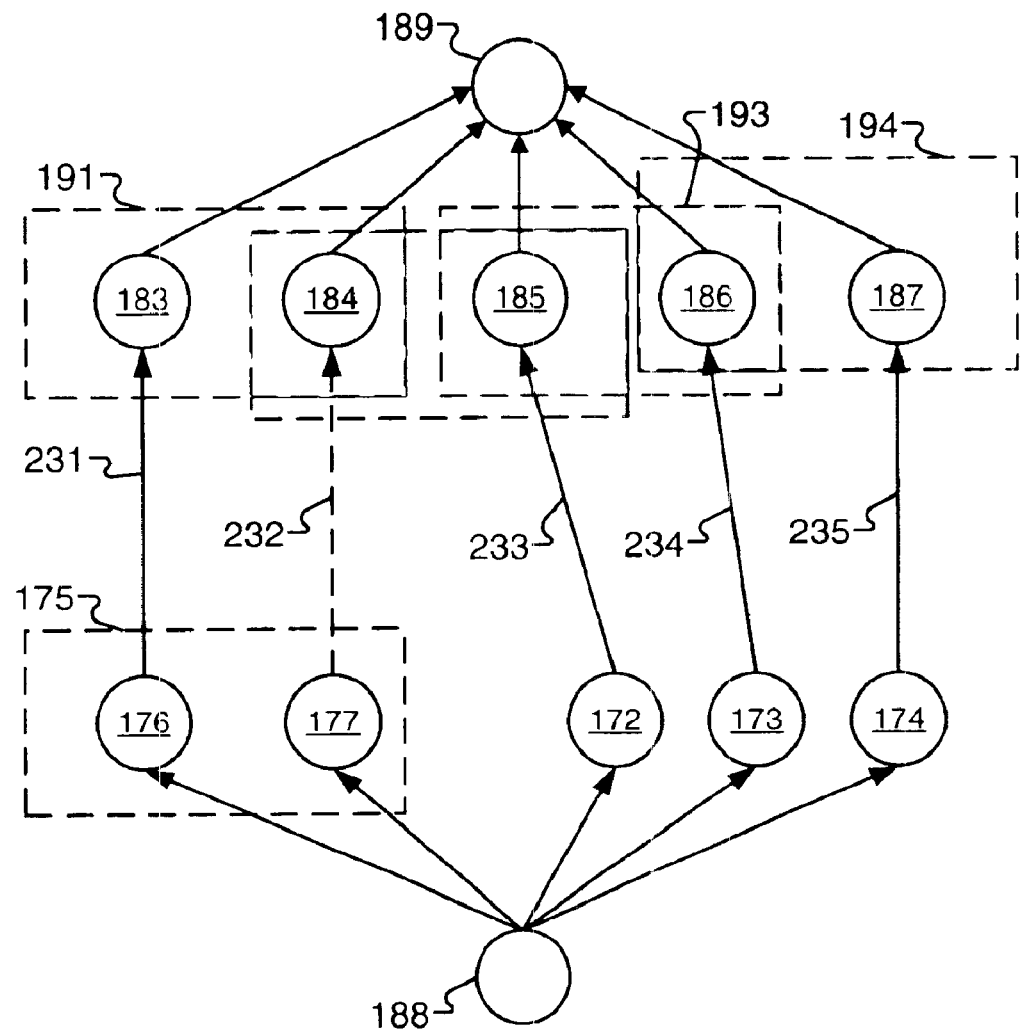
FIG. 3C shows an example of a feasible solution that may be obtained using the method of the present invention.

A new optimal matching is computed by applying network flow methods using the new costs. If an infeasible matching is obtained, the costs associated with the offending slot are changed. This process is repeated until a feasible matching is obtained. An example of such a matching is shown in FIG. 3C. It shows five edges 231–235 between five objects and five separate slots.

Figure 4:
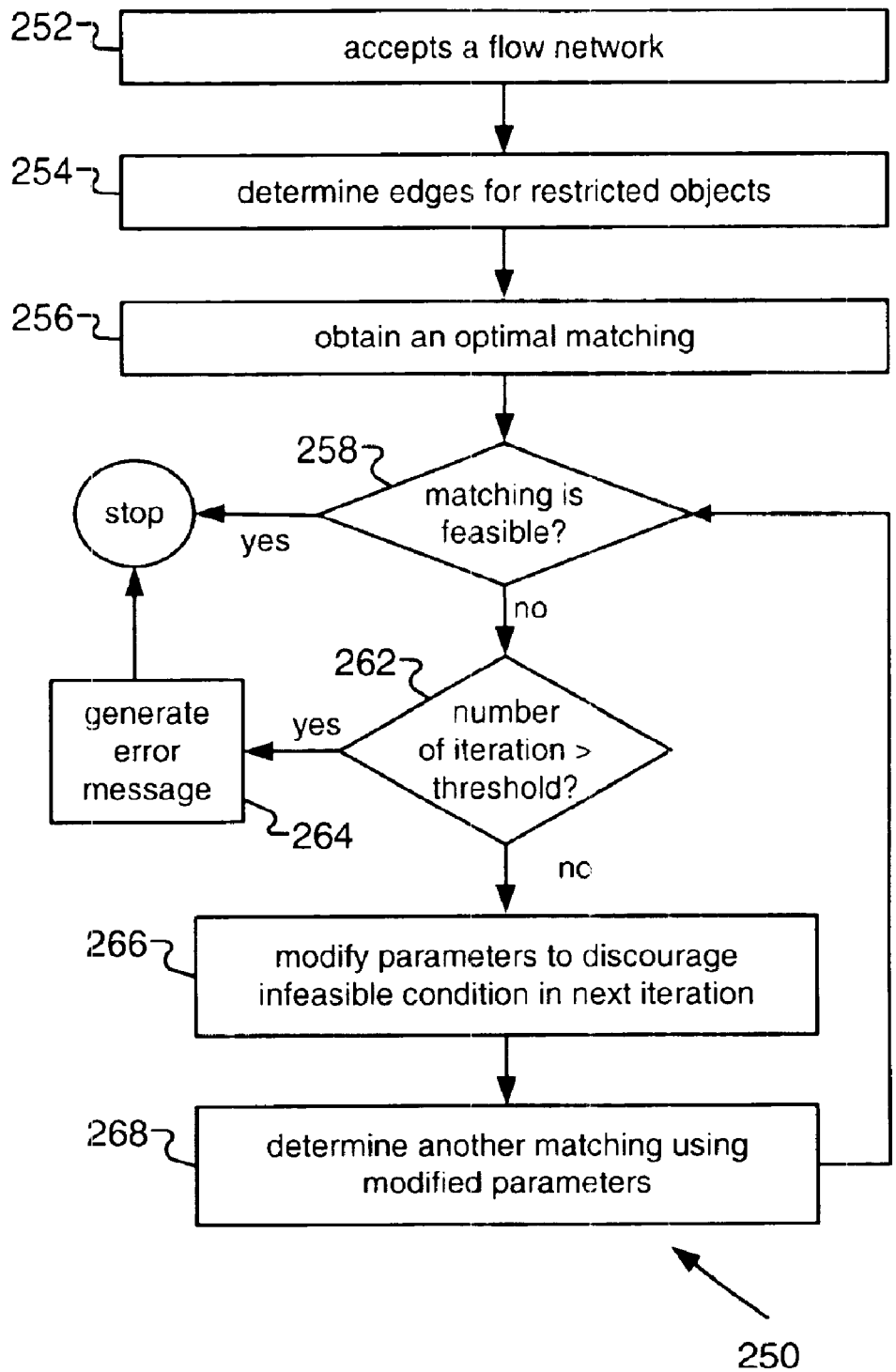
FIG. 4 is a flow chart showing an operation of the present invention.

The above described process is further illustrated in FIG. 4. It shows a process 250 that starts by accepting a flow network (step 252). In step 254, the slots are grouped together so that each group can be a candidate to match with the constrained objects. Edges between the constrained objects and the slot groups are determined in accordance with the above-described procedure. Costs are assigned. In step 256, process 250 obtains an optimal matching by applying minimum cost, maximum network flow techniques. In step 258, process 250 determines whether the matching is feasible. If this matching is feasible, process 250 stops. If the matching is infeasible, process 250 determines whether the maximum number of iterations has been executed (step 262). If the threshold number is reached, the process generates an error message (step 264) and then stops. If the threshold number is not reached, parameters of the flow network are changed to discourage the infeasible condition in the next iteration (step 266). An example of a parameter is the cost of edges in the flow network. Another optimal matching is obtained using the modified parameters (step 268). Process 250 branches back to step 258 to determine whether another iteration is needed.

Figure 1A:
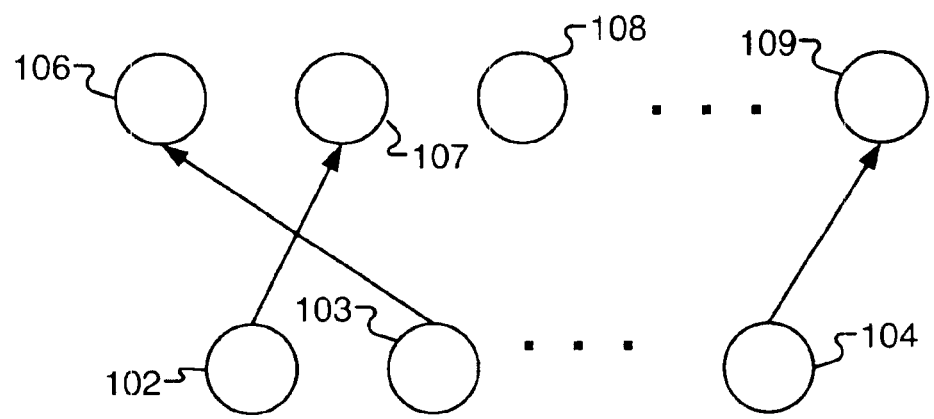
FIGS. 1A–1B show prior art matching between objects and slots.
Figure 5:
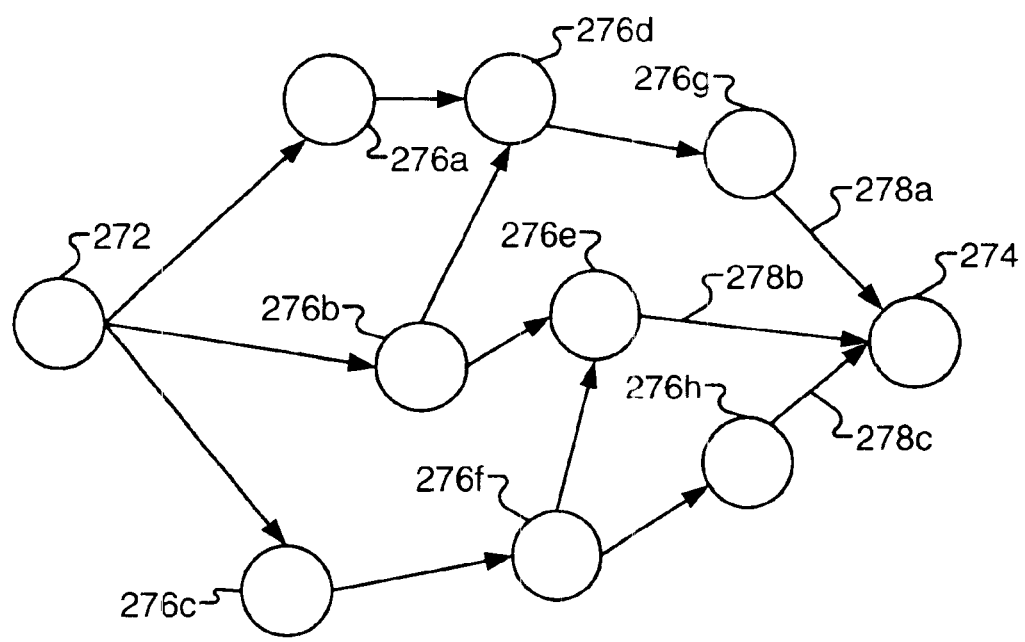
FIG. 5 shows an example network to which the invention can be applied.
Figure 1B:
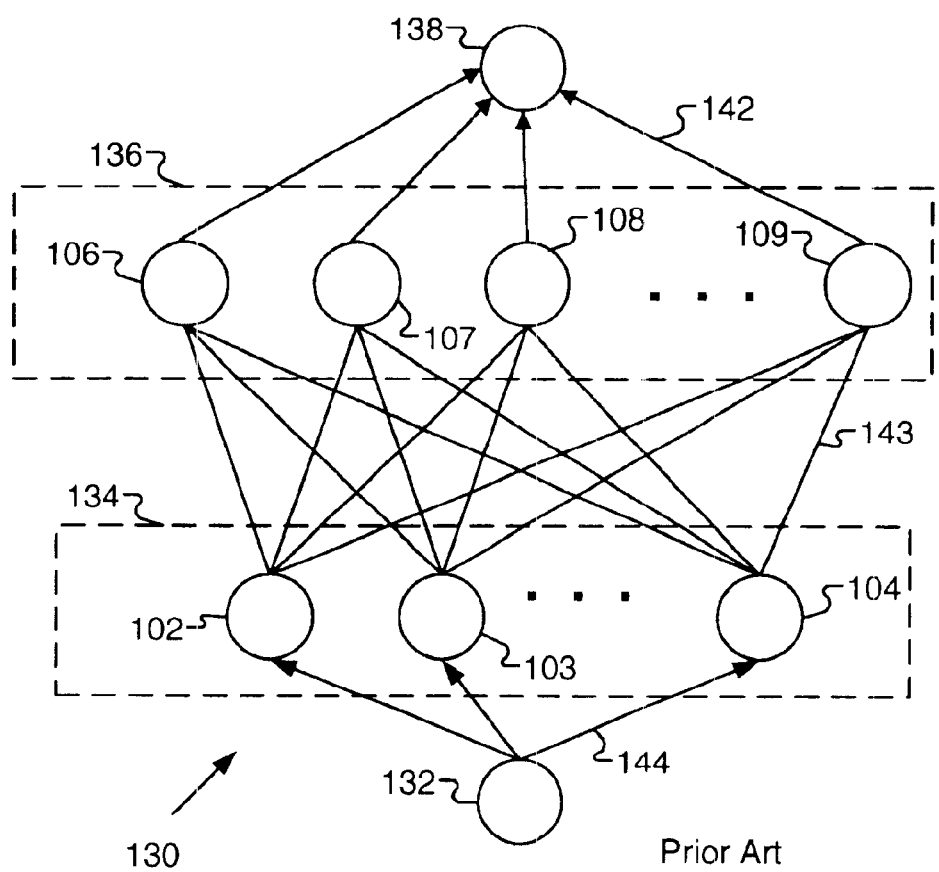

The above-described approach can be applied to other types of network flow situations. FIG. 5 shows one such flow network 270. It contains a source 272, a sink 274 and a plurality of intermediate nodes 276a–276h. In network 270, sink 274 has three edges (278a–278c) entering it. The normal minimum cost, maximum network flow solution will likely direct flows through all of these edges. If the constraint is that there can only be flow along two of the edges, the solution is not valid. The method of the present invention can be applied to find a valid solution. Specifically, network 270 can be adjusted to discourage flows to all three edges in the next iteration. One way to achieve this goal is to alter the capacity of one of the edges based on the amount of flow through the edges. For example, the capacity of the edge with the least flow can be set to zero. As a result, no flow can pass through that edge in the next iteration in which a new flow is computed. Another way to achieve this goal is to change the costs of the edges.

Figure 6:
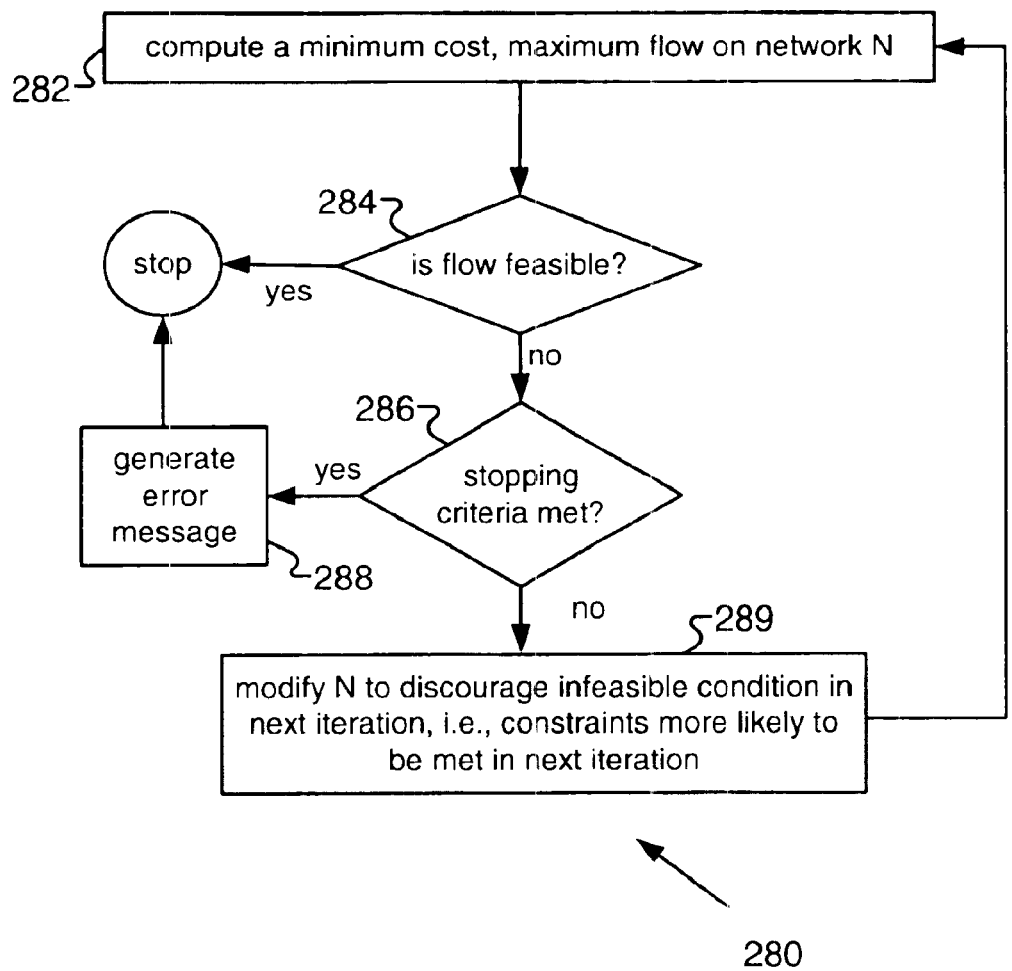
FIG. 6 is a flow chart of a process in accordance with the present invention.

FIG. 6 shows a process 280 for finding a solution for a network flow on which a set of constraints is imposed. The constraints cannot be "encoded" into the flow, and conventional methods cannot be used to find a solution. In step 282, a minimum cost, maximum flow solution is computed using conventional methods. In step 284, process 280 determines whether the solution is feasible (i.e., meets the constraints). If the solution is feasible, process 280 stops. If the solution is not feasible, process 280 determines whether other stopping criteria have been met (step 286). If one of the stopping criteria is met, no more iteration is performed. However, the solution is still invalid. Thus, an error message is preferably generated (step 288). Process 280 then stops. A user may then use other methods (such as exhaustive techniques) to generate a feasible solution. If more iteration is allowed, the network is modified to discourage the infeasible condition in the next iteration (step 289), i.e., the constraints are more likely to be met in the next iteration. Process 280 then branches back to step 282 to compute another minimum cost, maximum flow solution.

In addition to changing the costs and capacities, the modification can be achieved by other means, such as adding and/or deleting edges, nodes, sources and/or sinks, and/or otherwise altering the properties of these components. Also, the rate of modification may depend on the amount of infeasibility in the solution. For example, if the infeasible solution is very close to being feasible, then only small modifications to the network are likely necessary to achieve feasibility.

An application of the method of the present invention to place objects with partial shape restriction is disclosed below. One example of such an object is a kind of buffers called "tbufset," which is a set of tristate buffers (tbufs) driving the same signal. The tbufs in a tbufset have specific geometric relationship (e.g., fixed in one direction and have certain freedom in another direction). In some FPGAs, such as Virtex II (designed by Xilinx, Inc., the assignee of the present patent application), a tbufset contains a plurality of tbufs that occupy the same row in a placement x-y coordination grid. In Virtex II, the tbuf sites are always available in multiples of fours in every tbuf row. Also, only tbufs in the same tbufset can occupy these sites. No two tbufsets can overlap.

Figure 7A:
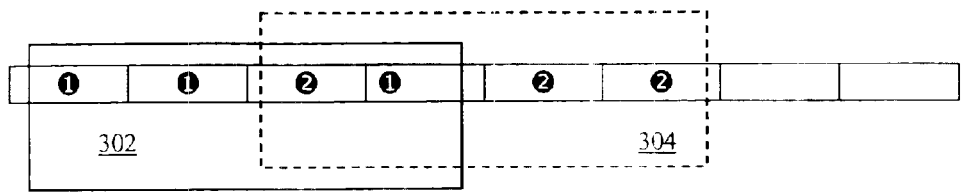
FIGS. 7A–7B show two examples of tbufsets.

FIG. 7A shows an example of two tbufsets that do not meet the above-described rules. The tbufs in the first tbufset are marked with the numeral "1" inside black circles, and the tbufs in the second tbufset are marked with the numeral "2". Each tbufset has three tbufs. The two tbufsets occupy six adjacent sites. Each site is represented by a small rectangle. A solid box 302 spanning four rectangles is used to show the four sites for the first tbufset and a dashed box 304 spanning four rectangles is used to show the four sites for the second tbufset. The two tbufsets overlap because the leftmost tbuf of the second tbufset and the rightmost tbuf of the first tbufset intrude into the territory of the other tbufset.

Figure 7B:
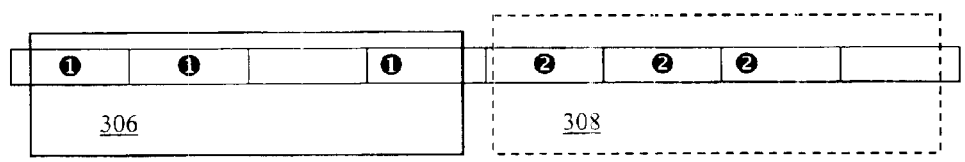

FIG. 7B shows an example of two tbufsets, shown as boxes 306 and 308 that meet the above-describe rule. Thus, it shows a valid placement of tbufsets.

Figure 8:
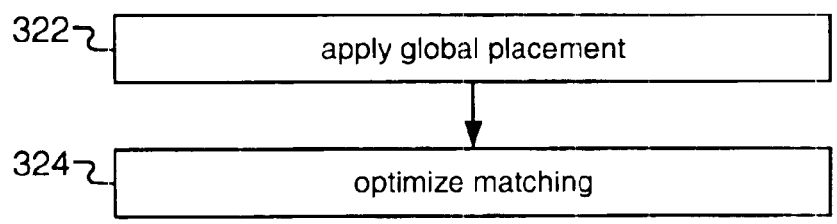
FIG. 8 is a flow chart showing an operation of the present invention.

In one embodiment of the present invention, a two-step process is used. This is shown in FIG. 8. In the first step (step 322), a global placement is applied to the whole FPGA, including the tbufsets. In general, global placement returns placement information (in real number form) on every component in a design. However, all placement sites in a FPGA are at integer locations. Consequently, there is a need for a post processing step to fit the real number solution to integer locations (called "fitting"). In this embodiment of the present invention, the fitting step is performed using the optimal matching method of the present invention (step 324).

Figure 9A:
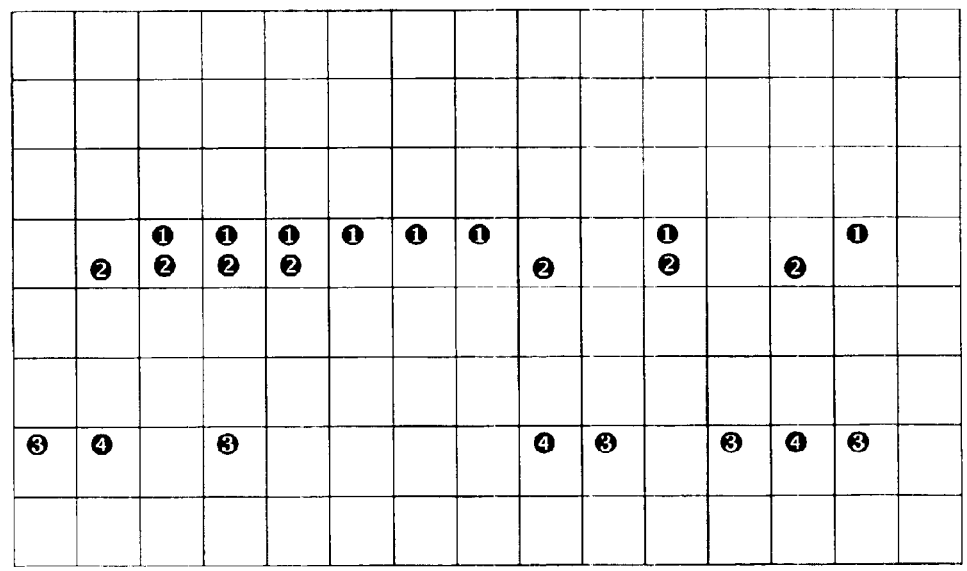
FIG. 9A shows the locations of four tbufsets generated by a global placement algorithm.

An application of these two steps is described. FIG. 9A illustrates the result after applying global placement. It shows a placement grid of eight rows and fifteen columns. These are possible locations for placing tbufs. Four tbufsets are shown, their tbufs labeled using numerals "1", "2", "3" and "4" inside black circles. The placement of the tbufs in the grid is the result of global placement (i.e., step 322). It can be seen that the first and second tbufsets are not valid because some of their tbufs occupy the same site. The third and fourth tbufsets are invalid because these two tbufsets overlap.

Figure 9B:
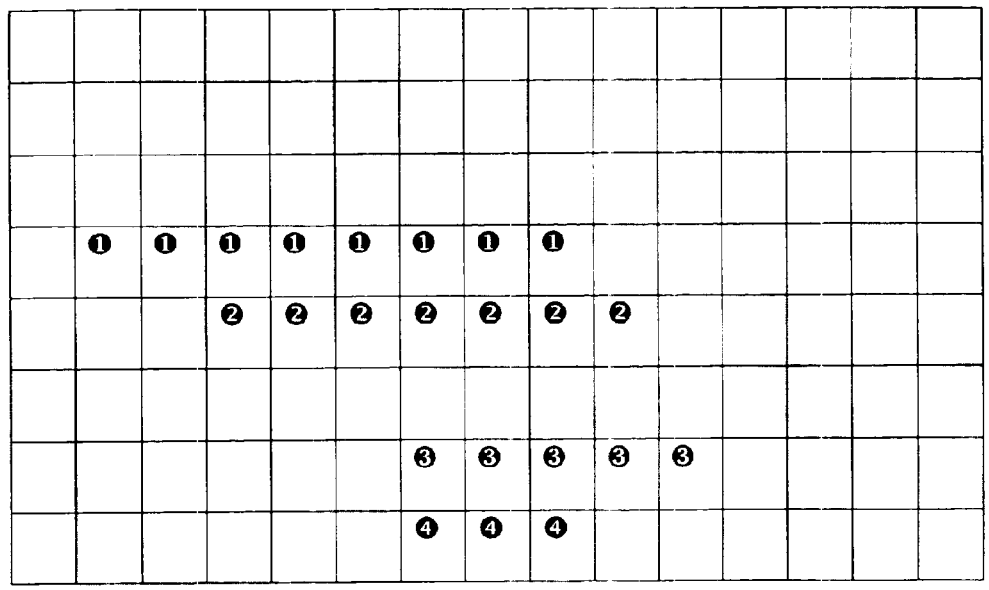
FIG. 9B shows a prior art placement.

A prior art fitting solution to remove invalid placement is shown in FIG. 9B. This approach sorts the tbufsets based on their criticality: fit the most critical tbufset first using breadth first search. The size of a tbufset is fixed apriori (e.g., the smallest size that can accommodate all the tbufs in the tbusfset). This ensures a solution when a feasible solution exists. The method tries to place the tbufset at the mean of the locations (produced by global placement) of the individual tbufs that constitute the set. Using the means solution as a starting point, a breadth first search is performed to find a vacant place for all the tbufs in the set. This procedure continues until all the tbufs in a set are fitted. One disadvantage of this approach is that the tbufset structure obtained from global placement is discarded. For example, in FIG. 9B all the tbufs in a row are bunched together. This results in large fitting errors and degradation in performance.

Figure 10:
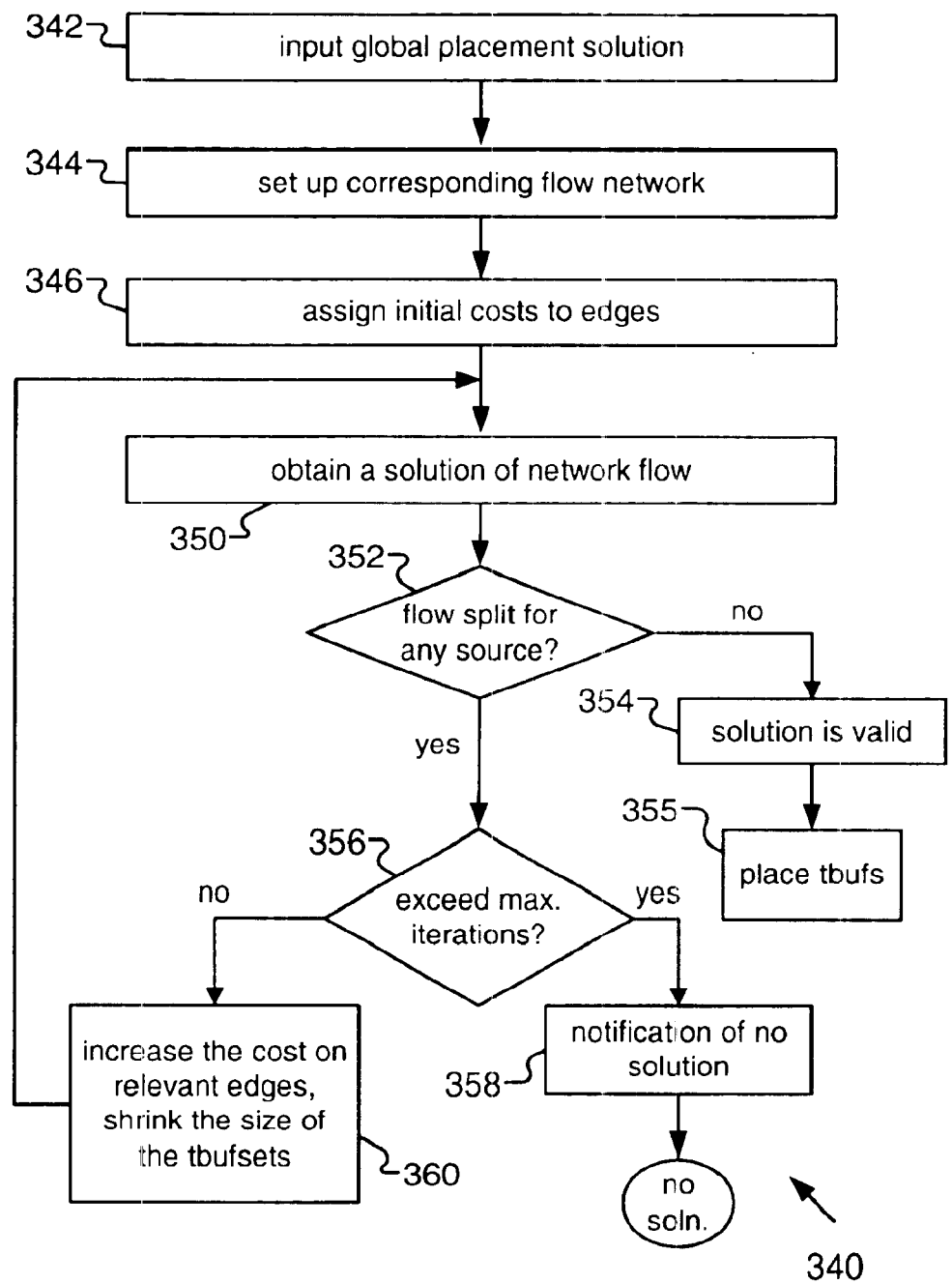
FIG. 10 is a flow chart showing the steps in placing tbufsets in accordance with the present invention.

FIG. 10 is a flow chart 340 showing more details of step 324 of FIG. 8. In step 342, the global placement solution is accepted as input. In step 344, a flow network is set up using information from the global placement. In one implementation, every tbufset is modeled as an object in the source vertex set (this object will simply be called a "source" in this implementation). The flow from a virtual source to the source is set equal to the size of the tbufset. In one embodiment, the size of the tbufset is calculated by taking the difference between the location of the leftmost tbuf and the rightmost tbuf in that set. The leftmost and rightmost locations in a tbufset are calculated from the global placement solution by snapping them to the nearest tbuf sites (neglecting the overlaps it might cause). Because of the requirement in Virtex II architecture, the size of a tbufset is rounded to multiples of four. For example, the size of the tbufset labeled "3" is 16 (multiples of 4) although the actual size is 14. Every row in the placement grid is modeled as a slot in the sink vertex set (each slot will simply be called a "sink" in this implementation). The capacity of a sink is the number of tbufs that a row can accommodate. Edges are formed between the sources and the sinks. An unconstrained tbufset (source) has edges to all the sinks as it can be placed in any row in the placement grid. The cost associated with an edge represents the cost that is incurred in assigning the corresponding source to the corresponding sink. The initial costs to the edges are assigned (step 346). In this implementation, the cost between a tbufset (source) and a row (sink) is directly proportional to the distance from the row in the global placement solution to the row under consideration. For example, if the source corresponds to the tbufset labeled "1" and the sink corresponds to the first row of the placement grid, the edge cost is proportional to 3.

In step 350, a conventional matching algorithm is used to find a minimum cost solution that meets the basic condition: (a) sink capacities are not violated, and (b) all the source flow is distributed to one or more sinks and there is no remaining flow. One problem of using conventional matching algorithm is that the solution may violate architectural constraint of the target integrated circuit (e.g., Virtex II). In the present implementation, all the tbufs in a tbufset need to be in the same row. This means that all the flow (i.e., size of tbufsets) from a source (i.e., tbufset) must be directed to one and only one sink (i.e., row). As a result, conventional algorithm may lead to infeasible solution. The method of the present invention is used to generate a feasible solution.

In step 352, it is determined that whether there is any split flow from any source (corresponding to more than one row for a tbufset). If there is no split flow, the placement is valid (step 354). The individual tbufs are then placed (step 355). If there is split flow, the placement is invalid. It is determined whether the allowable maximum number of iterations is exceeded (step 356). If this number is exceeded, there is no solution using this method. A corresponding notification is generated (step 358). The flow chart then terminates. If the number is not exceeded, the parameters of the flow network are changed with an aim to remove the split in the next iteration (step 360). The flow chart branches back to step 350 to obtain another solution.

One method to implement step 355 is described. It uses the result of the solution calculated in step 350, i.e., the sizes (or flows) and the location of the tbufsets, to calculate how far a tbufset can span. The tbufsets in the same row are sorted by the position of the leftmost tbuf in the set based on a global placement solution. Each tbufset is placed by packing individual tbufs in the set until all the tbufs in the set are accommodated by placing them to the nearest vacant positions from the positions suggested by global placement. This is repeated by all the sorted tbufsets.

More details about step 360 are now described. In one embodiment, all the sources that are assigned to multiple sinks are identified. The costs associated with the edges from these sources are changed (e.g., increased). The aim is to discourage splitting of flows. One way is to penalize all edges originated from an offending source, however each edge is penalized by a different factor. An edge that has lots of flow along it is penalized little and an edge with a small flow is penalized a lot. As a result, there is a stronger motivation for a flow to concentrate on one edge. If flow splitting persists, other parameters can be changes. For example, the size of the tbufsets can be reduced (see the discussion below for additional details).

Figure 9C:
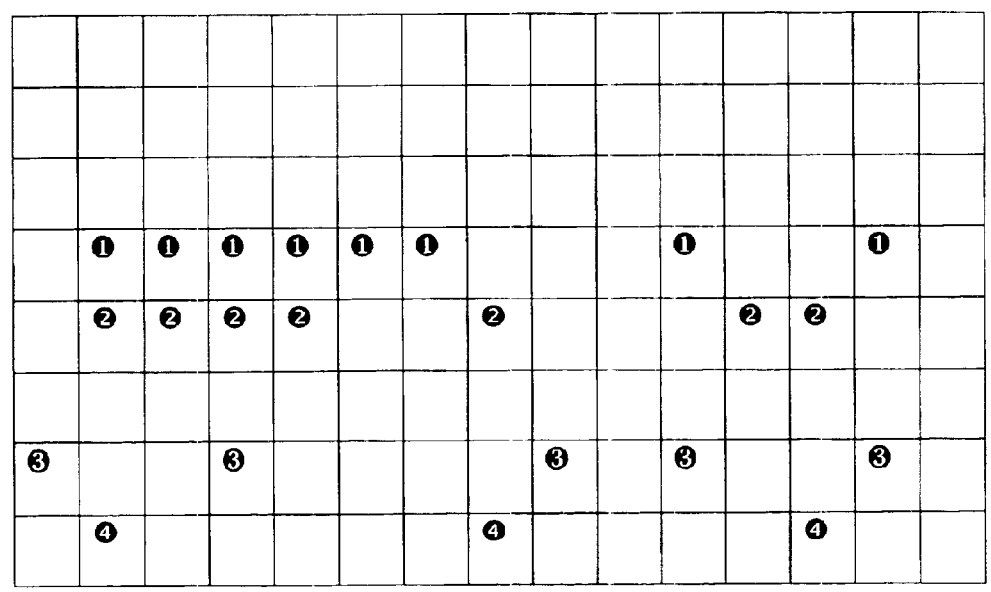
FIG. 9C shows one result of placing tbufsets in accordance with the present invention.

Applying the flow chart of FIG. 10 to the global placement solution in FIG. 9A, one solution is shown in FIG. 9C. Comparing the solutions shown in FIGS. 9B and 9C, it can be seen that the solution using the method of the present invention is closer to the original global placement. Thus, this solution is likely to have better performance compared to the prior art solution.

Figures 11A, 11B, 14:
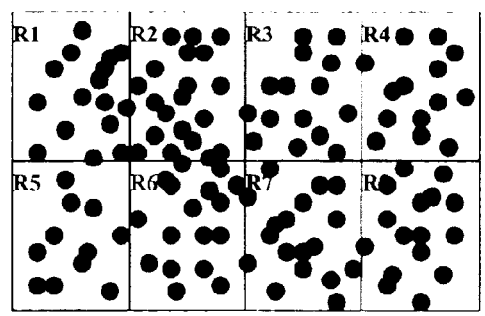
FIG. 11A shows the result of a global placement solution.
FIG. 11B shows a placement result using the present invention.
FIG. 14 shows an exemplary solution from a global placement.
Figure 12A:
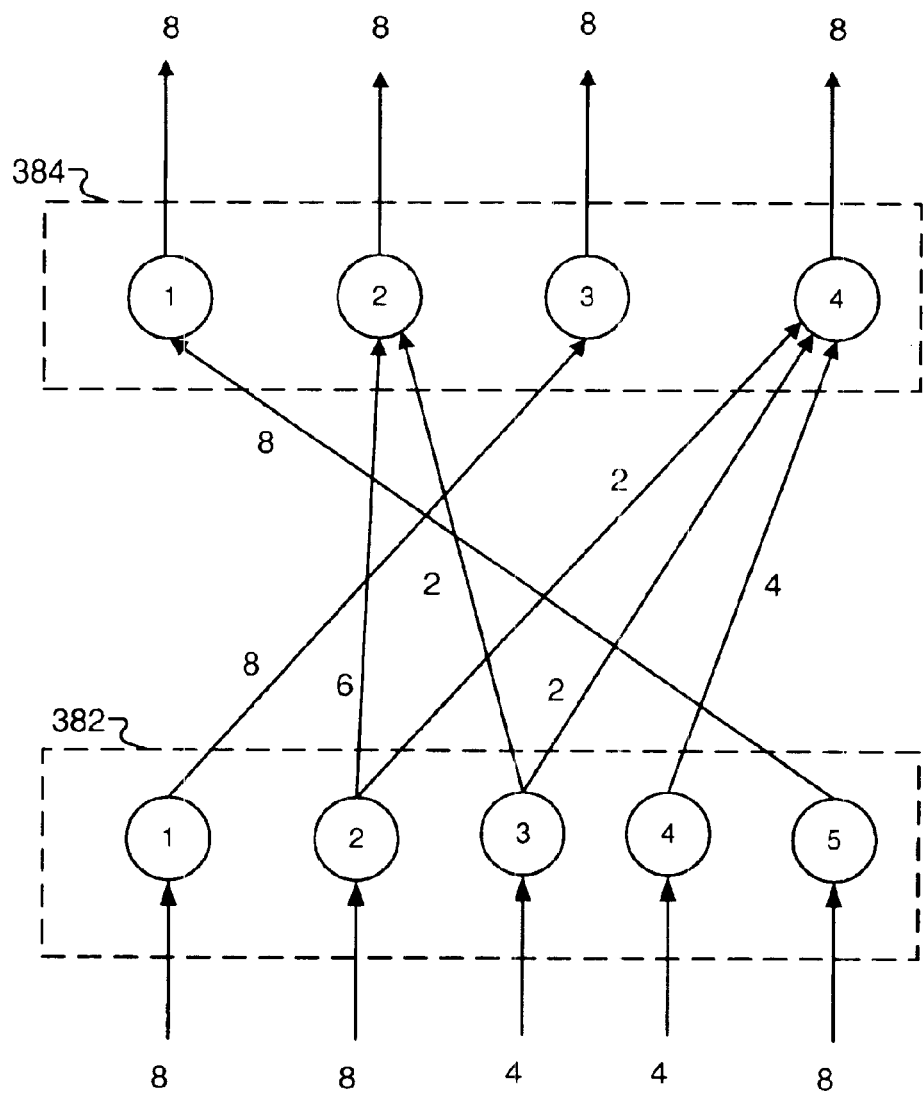
FIGS. 12A and 12B show snapshots of solutions in accordance with the present invention.

Another example of applying the method of the present invention is disclosed. In this example, a global placement solution is shown in FIG. 11A. This solution does not meet the constraints on tbufsets (the tbufsets labeled 2 and 3 overlap). The method of the present invention can be used to find a valid solution. FIG. 12A shows a snapshot of a solution in accordance with the present invention. It contains a source vertex set 382 and a sink vertex set 384. Source vertex set 382 contains five sources because there are five tbufsets. These sources are labeled 1–5 to conform with the labeling in FIG. 11A. Sink vertex set 384 contains four sinks because there are four rows. These sinks are labeled 1–4 to correspond to the rows (from top to bottom) in FIG. 11A. A flow is directed to each source, and the number associated with the flow is the size of the corresponding tbufset. Note that the size of tbufset 2 is 8 even though FIG. 11A indicates that its span is 5. This is because the size are in multiplies of 4. The sinks all have capacity of 8 because each row has eight sites. The connections between the sources and the sinks show the flows based on the solution (with the numbers indicate the magnitudes of the flows). For example, source 2 has a connection to sink 2 having a magnitude of 6 and a connection to sink 4 having a magnitude of 2. Note that this solution is invalid because the flow from each of sources 2 and 3 is divided into two sinks.

Figure 12B:
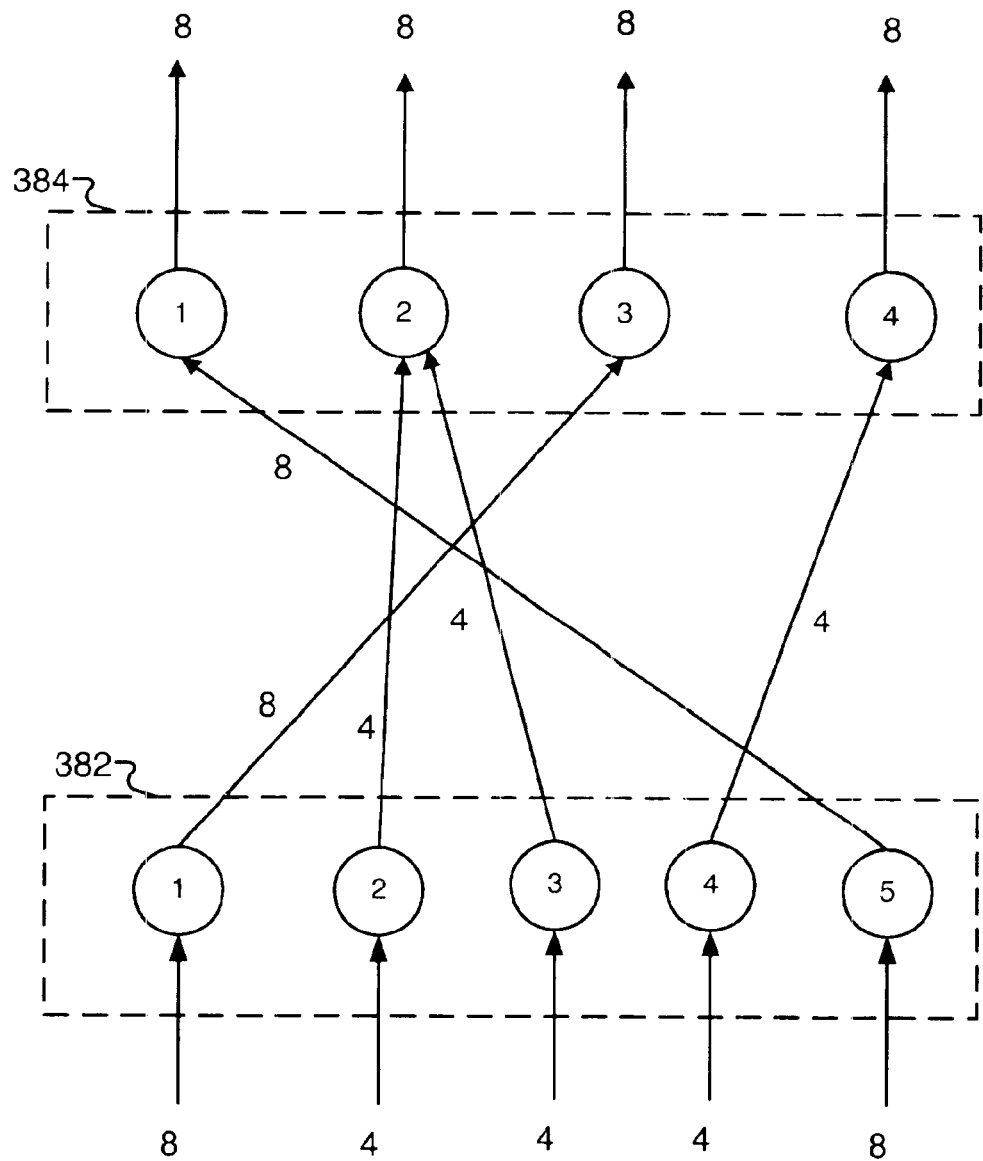

In accordance with one embodiment of the present invention, the flow to the source can be modified. Because source 2 is a problem source and it can be reduced, the flow to this source can be changed from 8 to 4. Note that the minimum length for this set is 4, and hence this reduction is a valid one. FIG. 12B shows a solution after this change is made. There is only one connection between a source and a sink. Thus, this is a valid solution.

FIG. 11B shows the placement corresponding to the solution of FIG. 12B. The rightmost tbufs of tbufset 2 is moved to the left so that all the four tbufs in this set occupy four sites. As a result, the tbufs in tbufset 3 can occupy the remaining four sites in the same row.

Another application of the present invention is in the placement of clocks in an integrated circuit (such as a FPGA). An FPGA has a large number of repetitive synchronous logic elements (e.g., flip-flops) that are driven by various clocks. For placement purpose, a large FPGA (such as the Virtex II) can be divided into regions. There are constraints on using clocks to drive logic elements in the regions. For example, Virtex II has 16 different clocks grouped into 8 primary-secondary pairs. One restriction is that only one member of a pair (either primary or secondary) can drive the logic elements in a region. Clocks that are restricted are called conflicting clocks (e.g., the primary and secondary clocks in a pair are conflicting clocks). One goal of the present invention is to find an optimal solution that meets the restrictions while minimally impacting standard placement objectives (e.g., wirelength and timing optimization).

Figures 13, 16:
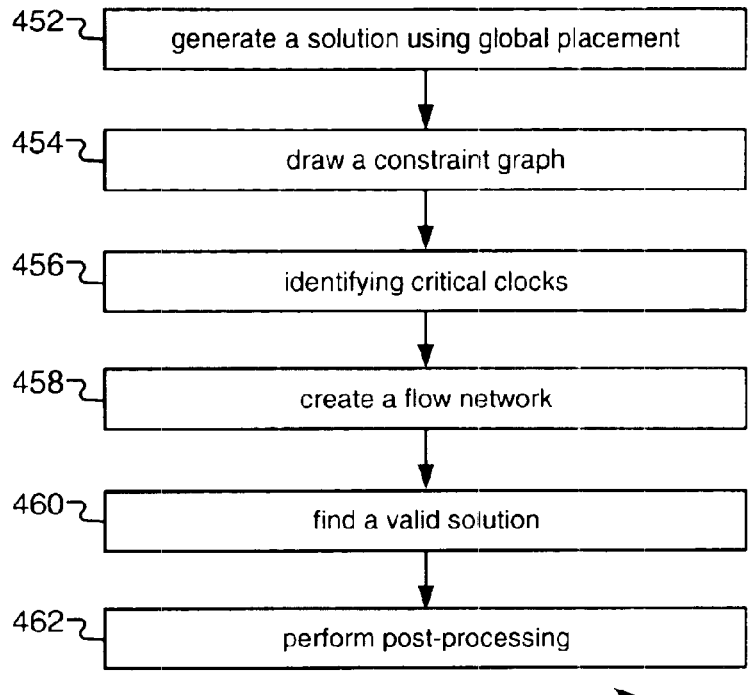
FIG. 13 is a flow chart showing an embodiment of the present invention as applied to placement of clocks in an integrated circuit.
FIG. 16 shows the placement regions in accordance with the present invention.

FIG. 13 is a flow chart 450 showing this embodiment of the invention. In step 452, a conventional global placement algorithm is used to generate a solution. This global placement imposes no constraint related to the clocks. Thus, the solution is optimal, but it may violate the above-described restrictions. In step 454, a constraint graph is drawn using the solution of step 452. This graph summarizes the solution for the clocks so that the relationship between the clocks can be easily determined. In step 456, critical clocks are identified. Critical clocks are those that are conflicting, and the conflict needs to be resolved. In step 458, a corresponding flow network is created. In step 460, an iterative procedure of the present invention is used to find a valid solution. In step 462, post-processing is performed to determine the range constraint of the clocks.

FIG. 14 shows an exemplary solution from a global placement (i.e., step 452). It shows an exemplary integrated circuit divided into 8 regions, R1–R8. The dots in FIG. 14 show the components connected to clocks. A region may have components connected to more than one clock (e.g., clock 1 and clock 2), and this situation is called contention.

Figure 15:
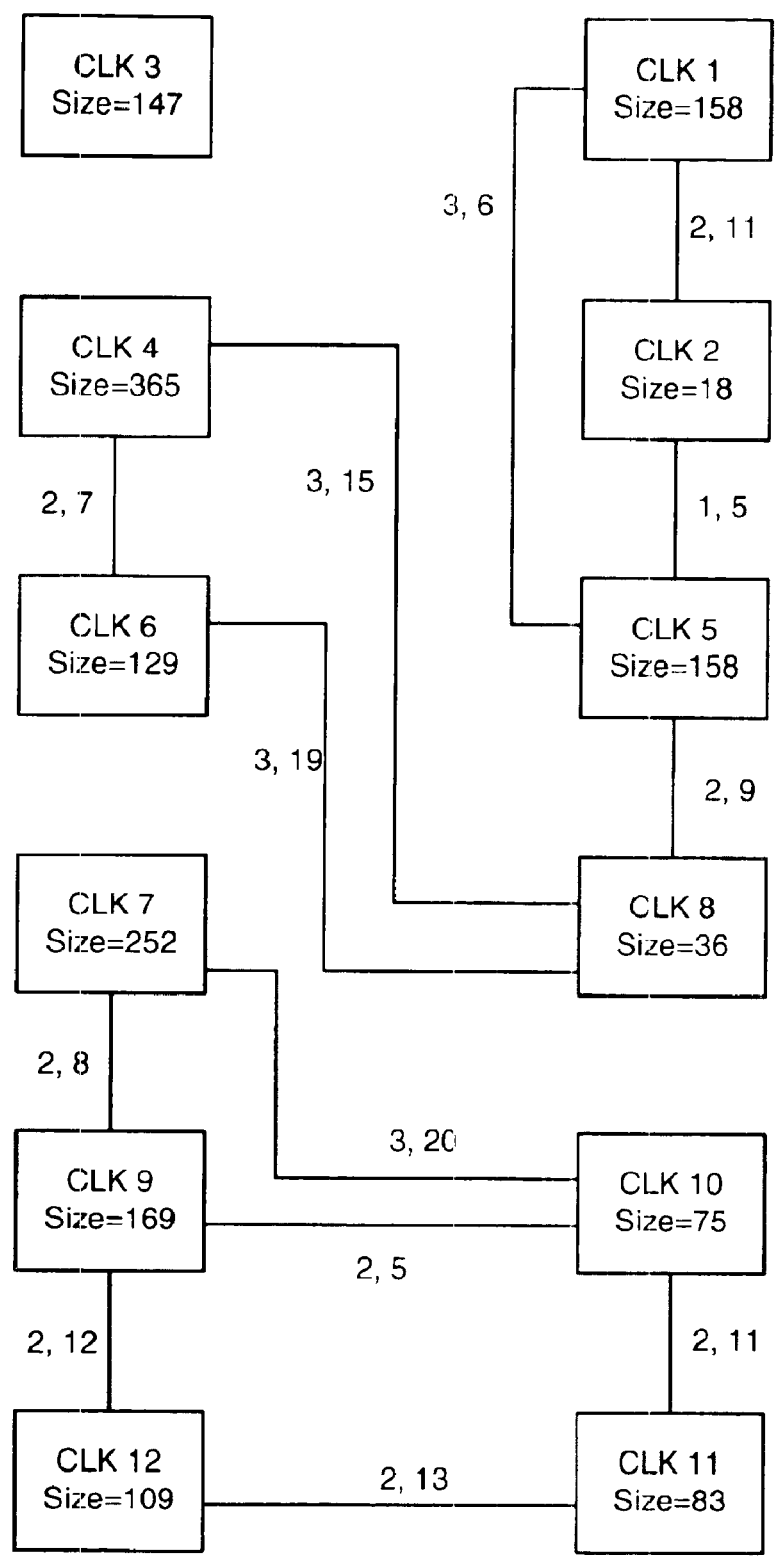
FIG. 15 is a portion of an exemplary constraint graph in accordance with the present invention.

FIG. 15 is a portion of an exemplary constraint graph generated after step 454. One rectangular box is used to represent a logical clock. A number labeled "size" inside a box corresponds to the total number of times the clock appears in all the regions in FIG. 14. For example, the "size=158" legend for clock 1 indicates that clock 1 occurs 158 times in the integrated circuit of FIG. 14. The clocks are connected to each other by lines. Each line is associated with two numbers: (a) how many regions the two clocks are in contention, and (b) a number equal to the sum of the minimum contention of these two clocks in each region. As an example, the line connecting clocks 1 and 2 in FIG. 15 has values of 2 and 11. It shows that clock 1 and clock 2 have two regions in contention. If, for example, region 1 has five sites for clock 1 and ten sites for clock 2, the minimum contention of clocks 1 and 2 in region 1 is five. Similarly, if region 2 has twelve sites for clock 1 and six sites for clock 2, the minimum contention of clocks 1 and 2 in region 2 is six. Because clocks 1 and 2 are in contention only in these two regions, the sum of the minimum contention is eleven. It should be noted that the complete constraint graph shows information about all the clocks, not just the twelve clocks shown in FIG. 15.

Some of the clocks in FIG. 15 do not have lines between them. It shows that there is no contention between the clocks.

The logical clocks shown in FIG. 15 need to be assigned to physical locations on an integrated circuit. If there are more clocks than regions, some of the regions will have more than one clock assigned to it. However, the architecture of Virtex II dictates that a primary-secondary pair cannot occupy the same region. Thus, clock assignment should aim for minimum contention so that only a small change is needed to resolve the contention. The constraint graph of FIG. 15 can be used for this purpose. In FIG. 15, clocks 1 and 3 do not any line between them. This shows that there is no contention between them. Thus, they can be chosen as a primary-secondary pair. Similar consideration applies to other clocks that do not have connecting lines (e.g., clocks 2 and 4). A user may set predetermined criteria for clock assignment based on the number of regions in contention and the number of minimum contentions (obtained from FIG. 15). After all the clocks are assigned to physical locations based on the predetermined criteria, critical clocks are identified. As discussed above, for Virtex II, critical clocks are those clocks that are in primary-secondary pairs.

The creation of a flow network (i.e., step 458) of the present invention can begin after the critical clocks are determined. In each region, the critical clocks and their cluster size are identified. An example is shown in FIG. 16. Each region may have several critical clocks. For example, region 1 (R1) has four critical clocks, designated as R1C1, R1C2, R1C3, and R1C4. The number next to a clock label indicates the cluster size, which is the number of components connected to a particular clock that is present in a particular region. For example, R1C1(20) in FIG. 16 means that there are 20 elements present in region 1 connected to clock 1. The cluster size can be obtained by just counting the components present in that region with that clock.

Figure 17:
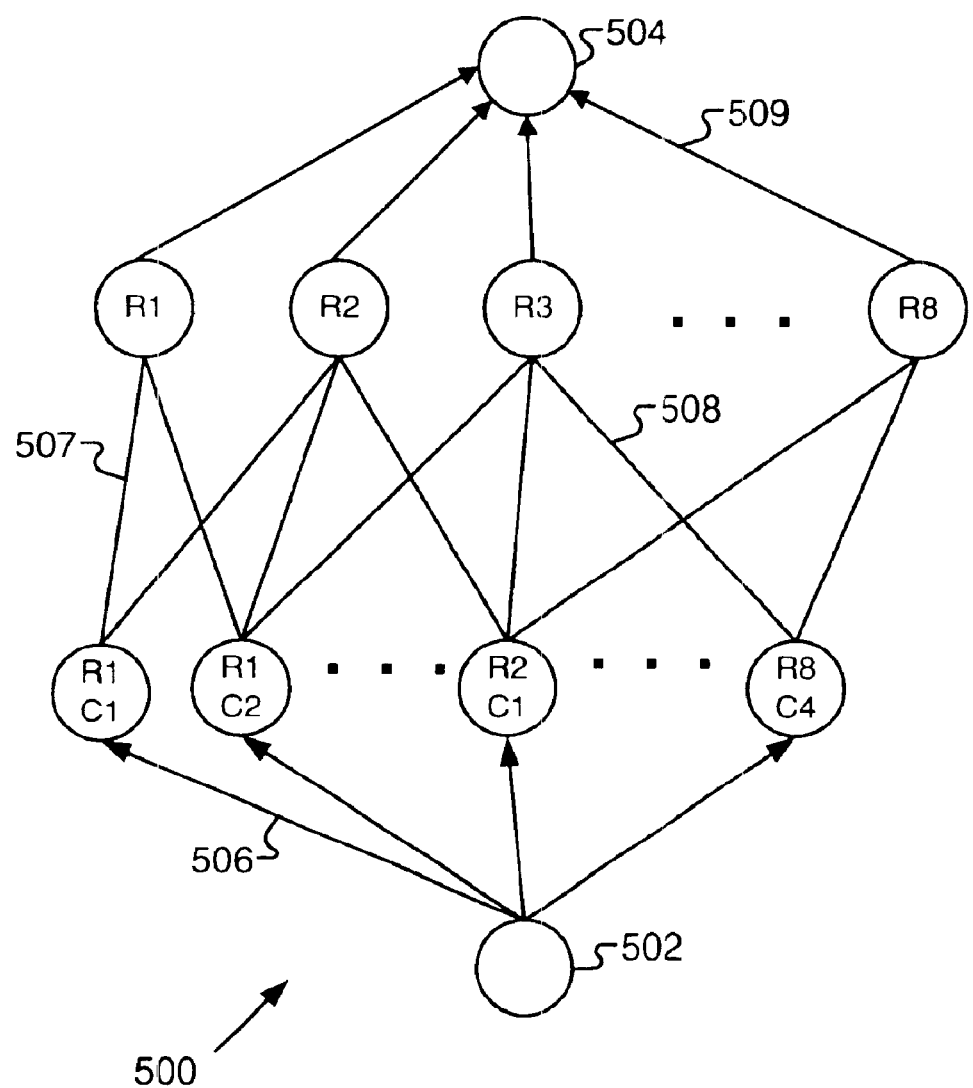
FIG. 17 is an exemplary flow network for solving the clock placement problem in accordance with the present invention.

A flow network 500 is now constructed (FIG. 17). It contains a virtual source 502 and a virtual sink 504. The collection of critical clocks in the regions, such as R1C1 and R2C2 of FIG. 16, forms the source vertex set. The flow from virtual source 502 to a source in the source vertex set is the cluster size of the source. In this flow network, non-critical clocks are not considered. The collection of regions, such as R1 and R2 of FIG. 16, forms the sink vertex set. The capacity of a sink is the number of sites available in the corresponding region. Edges (such as edges 506–509) are placed in the flow network. An edge links a source and a sink if all the logic elements from the source can be placed in the particular sink. The linking of the edges can reflect other constraints imposed by users of the placement method of the present invention. However, clock related constraints are not reflected in the edges. These constraints are handled by the method of the present invention.

Figure 18:
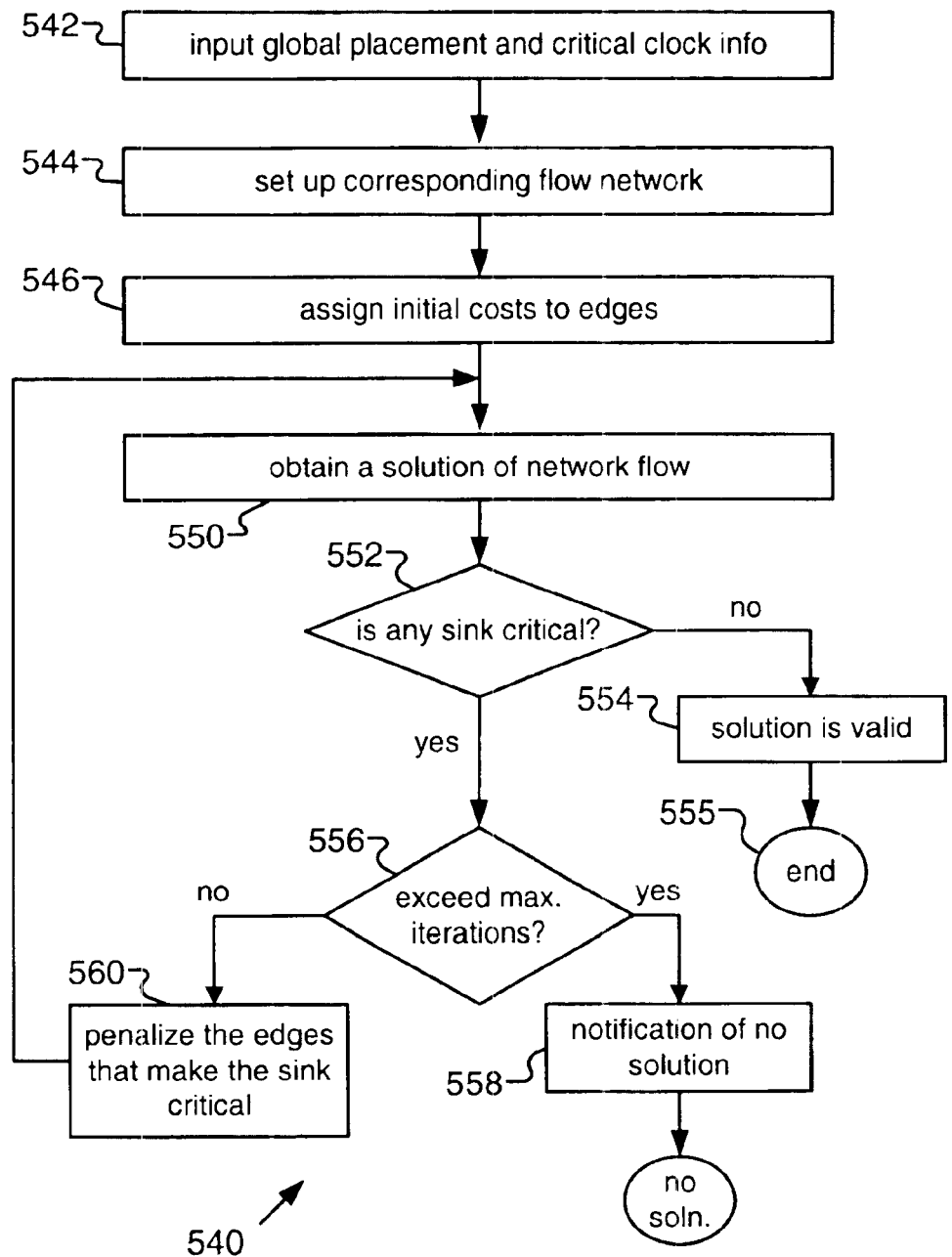
FIG. 18 is a flow chart illustrating the steps in solving the clock placement problem in accordance with the present invention.

FIG. 18 is a flow chart 540 of the solving of the flow network using the method of the present invention (corresponding to steps 458 and 460 in FIG. 13). In step 542, the global placement solution and critical clock information are used. In step 544, a flow network (see FIG. 17) is constructed. In step 546, initial costs are assigned to the edges. In one embodiment, the initial cost on an edge is directly proportional to the distance from the sink under consideration to the sink proposed by global placement solution. The cost will be minimum for an edge between a source and a sink if the sink is the one proposed by global placement for that particular source. In step 550, a conventional flow network algorithm is used to find a solution. In step 552, the solution is check to determined whether it is valid (in this example, a solution is invalid if at least one sink is critical, i.e., a sink that has at least one pair of critical resource assigned to it). If there is no critical sink, the solution is valid (step 554), and the flow chart stops (step 555). If the solution is invalid, it is determined whether the allowable maximum number of iterations is exceeded (step 556). If this number is exceeded, there is no solution using the approach of the present invention. A corresponding notification is generated (step 558). The flow chart then terminates. If the number is not exceeded, the edges that make the sink critical are penalized, with an aim to remove the criticality in the next iteration (step 360). The flow chart branches back to step 550 to obtain another solution.

Step 560 controls how fast the flow chart converges to a valid solution. In this step, the conflicting edges are penalized. The conflicting edges are found by picking the edges that makes a sink critical. A set of conflicting edges (to a sink) is the set of edges from all sources assigned to the sink and driven by the same critical clock. As each conflicting set corresponds to a conflicting clock, there will be as many pairs of conflicting sets as there are pairs of conflicting clocks assigned to this region. Each edge in the conflicting set penalizes all other edges in the other conflicting set by a factor that is proportional to its flow and size. Assume that clocks C1 and C2 are a critical pair. If there are 4 edges of clock C1 assigned to a sink S1, and 2 edges of clock C2 assigned to the same sink, then each edges of clock C1 penalizes each edge of clock C2 by a factor of its cluster size and flow (obtained from the solution). Similarly each edge of clock C2 penalizes each edge of clock C1 by a factor that is proportional to its flow and cluster size. Thus, the cost on edges of clock C1 is penalized twice, and cost on edges of clock C2 is penalized 4 times. The proportionality constant is chosen so that it does not radically change the cost in the previous iteration. With this kind of modification, the edges that have heavy flow will tend to divert the lighter conflicting edges out of the critical sink.

The post-processing step (i.e., step 462 of FIG. 13) is now described. The post-processing expands the regions for a source to its adjacent region (if possible). This step is important because it will be easier for a global placer algorithm that follows clock placement to find a solution. It is known that every time there are range constraints., the solution from a global placer will have to be modified to satisfy these constraints. A range constraint restricts the freedom of movement for the components. This in turn restricts the search space of the algorithm following clock placement and may ignore potentially good quality solutions. Hence, a bigger range constraint leads to a lesser restriction in the search space thereby improving the quality of solution. The post-processing is done by first sorting the sinks based on the decreasing order of their densities (defined as total flow/capacity) and expanding each sink in turn. Expanding a sink consists of expanding all the sources that are assigned to this sink. A source is expanded to a neighboring region if it can be placed in this region without violating clock region constraint. After all the expandable neighboring regions are found, the rectangular boundary that includes only those regions forms the range constraint to all the components in that source. Finally, range constraint is assigned to the logic of the integrated circuit (e.g., slices in an FPGA). During this step all the logic present in a particular source is assigned a range constraint based on the sinks (region) to which this source was assigned.

It can be seen from the above description that a novel application of network flow techniques to constrained optimization problems has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for placing a design onto an integrated circuit, said design comprising plural sets of electronic components and said integrated circuit being associated with a grid, said method comprising:

generating a global placement solution for said design;

setting up a flow network of said electronic components using said global placement solution;

obtaining a flow solution for said flow network;

if said flow solution is infeasible based on at least one of a geographical restriction of each electronic component in a set and a overlap restriction on said sets, modifying said network to discourage said infeasible solution and repeating said obtaining step.

2. The method of claim 1 wherein said grid has a plurality of rows and wherein a geographical restriction of each electronic component of said set includes restricting each electronic component of said set to a row of said plurality of rows.

3. The method of claim 2 wherein said electronic components are tristate buffers.

4. The method of claim 1 wherein said flow network comprises a plurality of sources associated with said electronic components, a plurality of sinks associated with said rows, and a plurality of edges connecting some of said sources to some of said sinks.

5. The method of claim 4 wherein at least one of said edges is associated with an initial cost, and said initial cost is related to deviation from said global placement solution.

6. The method of claim 5 wherein said modifying step modifies said initial cost.

7. The method of claim 4 wherein each of said sources is associated with a flow, said flow being related to a size of one of said sets of electronic components.

8. The method of claim 7 wherein said electronic components are tristate buffers.

9. The method of claim 7 wherein said modifying step modifies said flow.

10. The method of claim 4 wherein each of said sinks is associated with a capacity, said capacity being related to said electronic components that can be accommodated by one of said sinks.

11. The method of claim 10 wherein said electronic components are tristate buffers.

12. The method of claim 1 wherein said modifying and said repeating steps are terminated if a predetermined stopping criterion is reached.

13. The method of claim 1 wherein said overlap restriction on said sets comprises each set of said sets does not overlap with any other set.

14. A method for placing a design onto an integrated circuit, said design comprising plural sets of electronic components and said integrated circuit being associated with a grid, each of said electronic components in a set being geographically restricted, said method comprising:

generating a global placement solution for said design;

setting up a flow network of said electronic components using said global placement solution;

obtaining a flow solution for said flow network;

if said flow solution is infeasible, modifying said network to discourage said infeasible solution and repeating said obtaining step; and wherein said grid has a plurality of rows, each of said electronic components in at least one of said sets is restricted to a row, and said flow network comprises a plurality of sources associated with said electronic components, a plurality of sinks associated with said rows, and a plurality of edges connecting some of said sources to some of said sinks, and wherein at least one edge is associated with an initial cost related to said global placement solution and a row under consideration.

15. The method of claim 14 wherein said initial cost is proportional to a difference between said global placement solution and said row under consideration.

16. The method of claim 15 wherein said modifying step modifies said initial cost.

17. The method of claim 14 wherein each of said sources is associated with a flow, said flow being related to a size of one of said sets of electronic components.

18. The method of claim 17 wherein said electronic components are tristate buffers.

19. The method of claim 17 wherein said modifying step modifies said flow.

20. The method of claim 14 wherein each of said sinks is associated with a capacity, said capacity being related to said electronic components that can be accommodated by one of said sinks.

21. The method of claim 20 wherein said electronic components are tristate buffers.

22. The method of claim 14 wherein each of said sinks has a capacity and each of said sources has a flow, and wherein said flow solution meets a requirement that said capacity is not violated and a requirement that said flow is fully distributed to one or more sinks.

23. The method of claim 22 wherein said infeasible solution comprises a split flow.

24. The method of claim 20 wherein said electronic components are tristate buffers.

25. The method of claim 23 wherein said modifying step comprises changing said initial cost to remove said split flow in next iteration of said obtaining step.

26. The method of claim 23 wherein said split flow is associated with at least two edges, said changing step comprises penalizing said at least two edges by a different factor.

* * * * *